United States Patent
Hynecek

(10) Patent No.: US 6,680,222 B2
(45) Date of Patent: Jan. 20, 2004

(54) SPLIT-GATE VIRTUAL-PHASE CCD IMAGE SENSOR WITH A DIFFUSED LATERAL OVERFLOW ANTI-BLOOMING DRAIN STRUCTURE AND PROCESS OF MAKING

(75) Inventor: Jaroslav Hynecek, Allen, TX (US)

(73) Assignee: Isetex, Inc, Allen, TX (US)

( * ) Notice: Subject to any disclaimer, the term of this patent is extended or adjusted under 35 U.S.C. 154(b) by 125 days.

(21) Appl. No.: 10/071,337

(22) Filed: Feb. 8, 2002

(65) Prior Publication Data
US 2002/0094599 A1 Jul. 18, 2002

Related U.S. Application Data

(63) Continuation-in-part of application No. 09/434,451, filed on Nov. 5, 1999, now Pat. No. 6,369,413.

(51) Int. Cl.[7] .............................................. H01L 21/339
(52) U.S. Cl. .......................... 438/144; 438/60; 438/75; 438/79; 438/145
(58) Field of Search ............................ 438/75, 76, 144, 438/59, 60, 77, 78, 79, 145; 257/215, 216, 218

(56) References Cited

U.S. PATENT DOCUMENTS

| | | | | |
|---|---|---|---|---|
| 4,229,752 A | * | 10/1980 | Hynecek | 257/217 |
| 4,883,767 A | * | 11/1989 | Gray et al. | 438/138 |
| 5,118,631 A | * | 6/1992 | Dyck et al. | 438/79 |
| 5,453,632 A | * | 9/1995 | Hynecek et al. | 257/247 |
| 5,464,996 A | * | 11/1995 | Hynecek | 257/230 |
| 5,837,563 A | * | 11/1998 | Hynecek | 438/60 |

FOREIGN PATENT DOCUMENTS

EP     0059547    *    8/1982    ............ H01L/31/06

OTHER PUBLICATIONS

Ohtsuru et al. "Performance of FT–CCD image sensor with single layer poly–silicon electrode", Jul. 1999, ITE Technical Report, vol. 23, No. 49, pp. 31–36.*

* cited by examiner

Primary Examiner—Maria Guerrero
(74) Attorney, Agent, or Firm—John E. Vandigriff

(57) ABSTRACT

Generally, and in one form of the invention, a monolithic solid state image-sensing device is disclosed. The device utilizes only a single layer of polysilicon deposition in its fabrication process that is split into two or more phases by very narrow gaps. The single polysilicon layer makes the fabrication process simpler and more compatible with modern semiconductor manufacturing technology. The device also incorporates a lateral anti-blooming drain structure that is formed by a self-aligned diffusion process and does not need a polysilicon gate for its proper function.

6 Claims, 11 Drawing Sheets

SPLIT-GATE VIRTUAL-PHASE CCD IMAGE SENSOR WITH A DIFFUSED LATERAL OVERFLOW ANTI-BLOOMING DRAIN STRUCTURE AND PROCESS OF MAKING

This application is a continuation-in-part of application Ser. No. 09/434,451, filed Nov. 5, 1999 now U.S. Pat. No. 6,369,413.

FIELD OF INVENTION

The invention relates to solid state image sensors, and specifically to a class of Virtual Phase (VP) image sensors that include in their fabrication process only a single layer of polysilicon deposition. The sensors may also incorporate Lateral Overflow Anti-blooming Drain (LOD) structures.

BACKGROUND OF THE INVENTION

Standard CCD image sensors consist of pixel elements that include two or more gates fabricated by depositing more than one polysilicon layer on top of a suitable gate dielectric layer. The exception to this rule are devices fabricated by the VP technology, described in the U.S. Pat. No. 4,229,752 to Hynecek (1980), where charge is transferred from pixel to pixel by clocking only a single gate electrode. A CCD device that needs only a single gate for its operation offers an advantage in fabrication since all the electrodes of each CCD register in the entire image sensor array can be fabricated by depositing only a single polysilicon layer. This results in higher performance and in significant cost savings not only in manufacturing but also in device applications where fewer peripheral circuits, gate drivers, are needed. Among other advantages of the VP technology are low dark current due to the surface state pining effect and high Quantum Efficiency (QE) from deep UV to near IR spectral regions. Unfortunately the VP technology also has some disadvantages. In order to achieve the single electrode clocking, several ion implantation steps are incorporated into the process. This partially offsets the manufacturing cost savings and also makes the CCD charge transfer only unidirectional. The second disadvantage is in higher clocking voltages that have to be applied to these devices to accomplish an efficient charge transfer with a high charge well capacity.

It is thus desirable to develop a new CCD technology that retains the advantages of the VP concept and at the same time would minimize or eliminate disadvantages. In particular, a single polysilicon layer is a very attractive feature, since the single polysilicon deposition step is compatible with modern CMOS manufacturing technology and makes the on-chip CCD and CMOS system integration easier. The advantages of a CCD device with only a single polysilicon layer have also been recognized by others, as found in the article: "Performance of FT-CCD Image Sensor with Single Layer Poly-Silicon Electrode" by Y. Okada, Y. Ohtsuru, S. Izawa, N. Taino, and M. Hamada. The article was published in the proceedings of: "1999 IEEE Workshop on Charge Coupled Devices and Advanced Image Sensors", paper R35, Jun. 10–12, 1999.

Thus it is the purpose of this patent to show how a modern CCD sensor can be manufactured using only a single polysilicon deposition step in its fabrication process while maintaining the low dark current and high quantum efficiency of the previously developed VP technology. Furthermore it will be shown that an efficient LOD anti blooming structure can also be incorporated into such a device and that it does not require a polysilicon gate for its proper function.

And finally, it will be shown that a multidirectional charge transfer, as well as processing simplification, are obtained by splitting the single polysilicon gate into two or more independently clocked gate electrodes by very narrow gaps.

SUMMARY OF THE INVENTION

It is herein recognized that a need exists for solid state image-sensing devices that are fabricated on a suitable semiconductor substrate by incorporating only a single polysilicon deposition step in their fabrication processes. It is further recognized that a need exists that such devices also includes the LOD anti blooming drain structure, can be operated with low clocking voltages, and can maintain high performance such as the low dark current and high QE.

Generally, in one embodiment of the invention, a plan view of a typical image area CCD pixel is given with its corresponding cross sections in various stages of fabrication process. The key processing steps forming the essential features of the cell are described in detail. This includes the formation of vary narrow gaps that separate the polysilicon gate electrodes and the formation of the LOD anti-blooming drain structure.

In another embodiment of the invention, methods of incorporating the described cells into several typical image sensor architectures are given including their operation with the details of timing diagrams that improve the dark current performance and extend the operation dynamic range.

The invention thus provides many advantages including simplified fabrication processing with only a single level polysilicon deposition, lower clocking voltage operation, smaller parasitic electrode-to-electrode capacitances, high quantum efficiency, low dark current, LOD anti-blooming, extended dynamic range, and high flexibility of incorporation into many existing image sensor architectures. The single polysilicon deposition processing step makes the described CCD technology ideally suited for integration with modern CMOS circuits and systems.

DETAIL DESCRIPTION OF PREFERRED EMBODIMENTS

Figure 1:
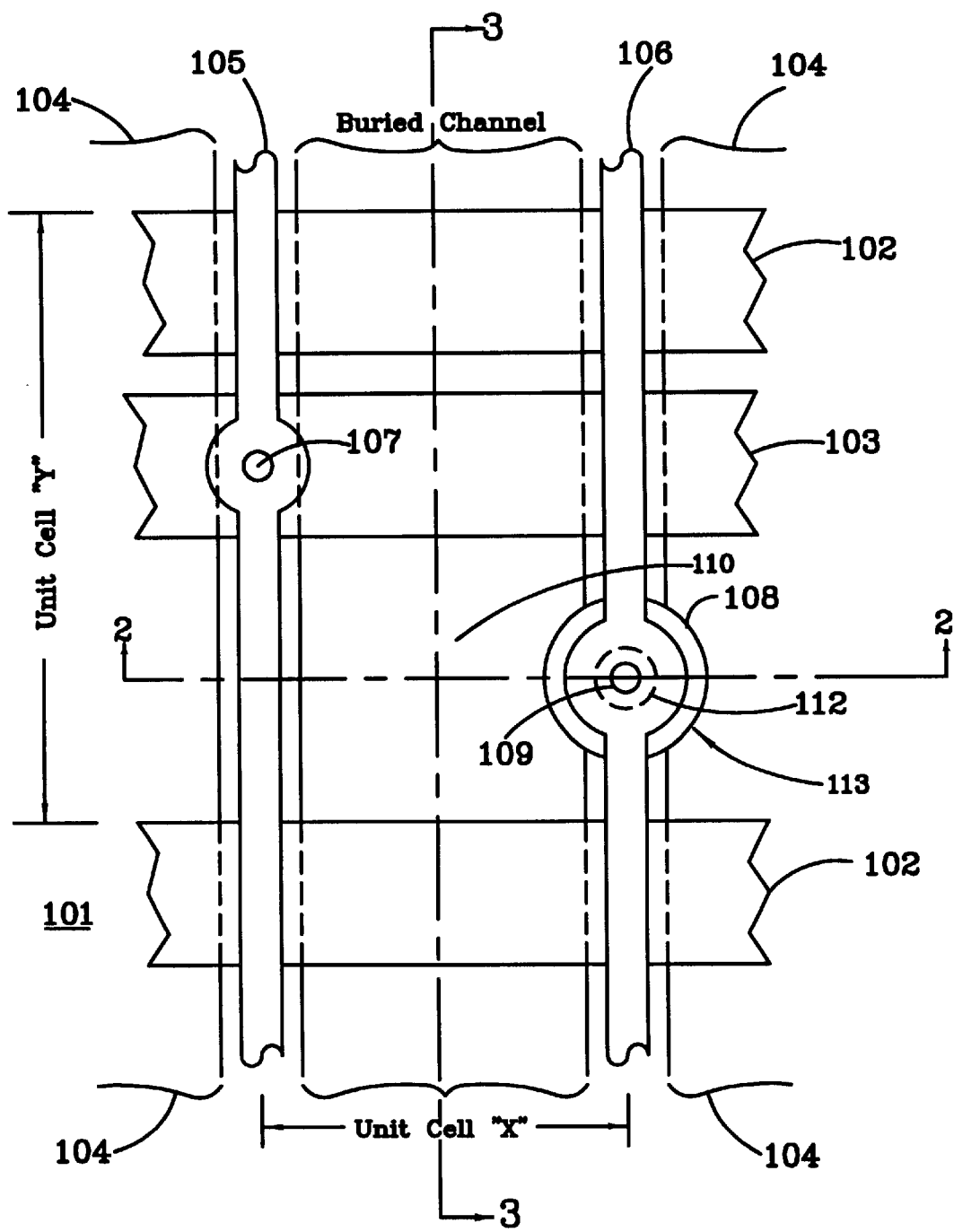
FIG. 1 shows a CCD cell in plan view according to the invention.

The preferred embodiment of the typical CCD cell plan view is shown in FIG. 1. The drawing is somewhat simplified and does not show all the layers that have been incorporated into the cell during the fabrication process. Some of the ion implantation layers and the final dielectric overcoat layer have been omitted to preserve the clarity of the drawing. The ion implantation layers will, however, be indicated on the corresponding cell cross sections that are shown in the subsequent figures and illustrate the device progression through the individual processing steps of the fabrication process.

In FIG. 1, a portion of an array of cells 101 is shown with a single cell shown in the area defined by Unit Cell "X" and Unit Cell "Y". Two metal busses 105 and 106 extend across the unit cell. A contact hole 107 is in buss 105 above the electrode 103. Interconnect layer 106 partially covers anti-blooming structure 113 that has a ring 108, central drain region 112 and an opening 109 which is a contact hole to the anti-blooming drain. The buried channel region 104 is formed by ion implantation using a suitable mask. Cross sections 1—1 and 2—2 are discussed below with reference to FIGS. 2a–2f and 3a–3d.

The modern Integrated Circuit (IC) manufacturing process usually starts with a clean wafer of a uniformly doped semiconductor 201, called substrate, on which a suitable dielectric layer, such as silicon dioxide 202 is grown. The substrate 201 may be, for example, a bulk silicon material or a thick epitaxially grown layer of semiconductor material formed on another suitably doped substrate. The typical doping concentration of the substrate 201 is on the order of 1.0E+14 to 1.0E+16 ions per cm3.

Figure 2A:
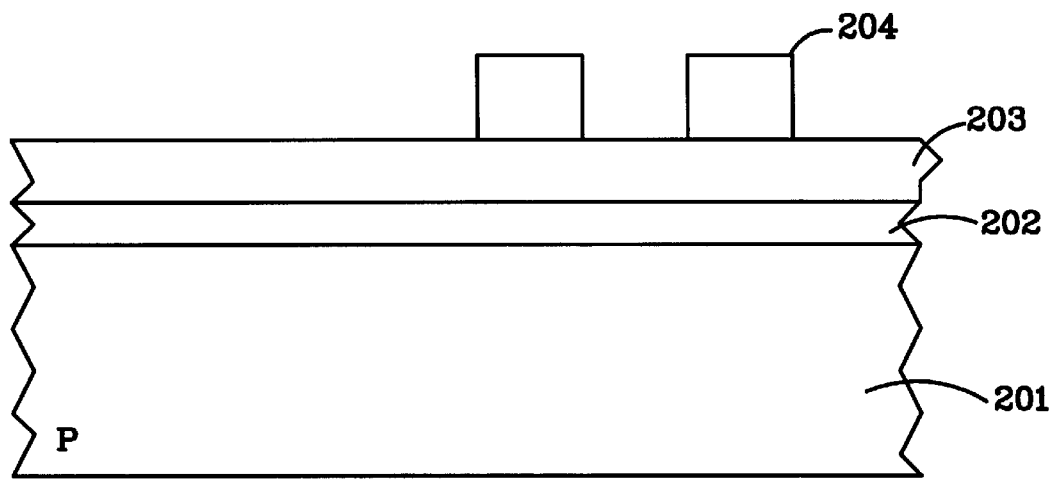
FIGS. 2a–2f show processing steps used in creating a LOD anti-blooming CCD structure.
Figure 2B:
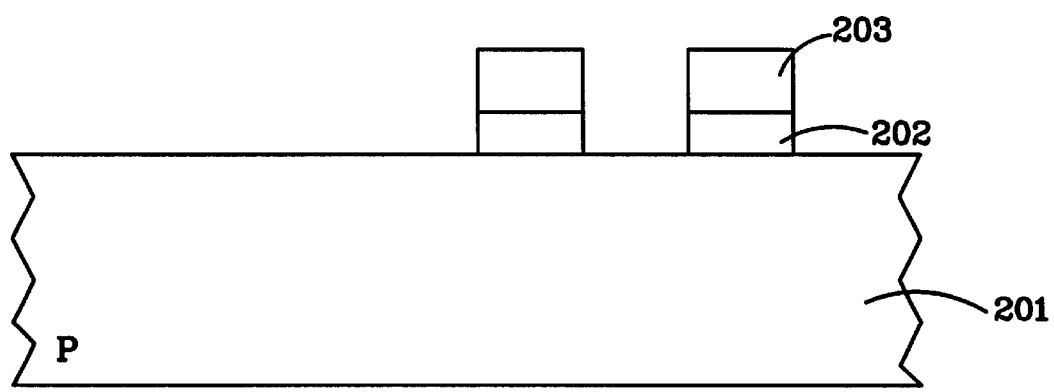
Figure 2C:
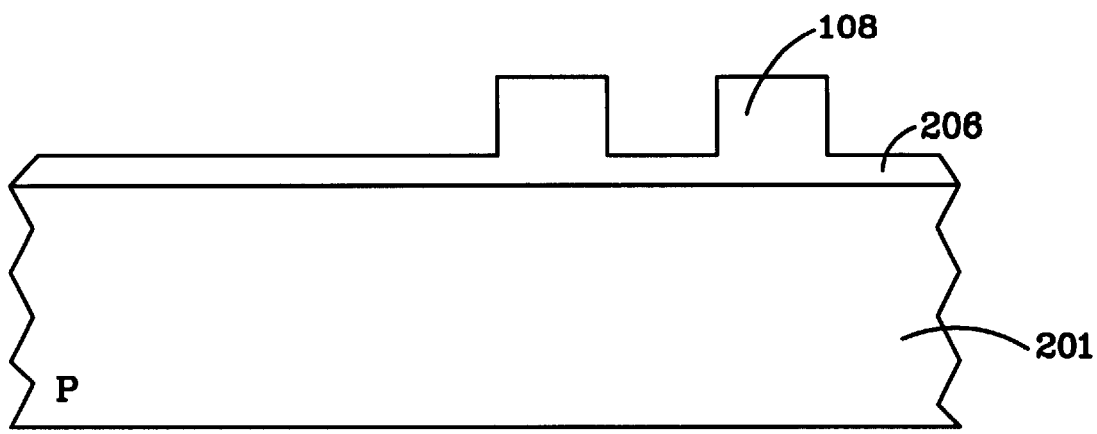

FIGS. 2a–2f show basic processing steps that are needed to create the LOD anti-blooming structure 113 (FIG. 1) and corresponds to the pixel cross section in the direction 2—2 of FIG. 1. The LOD fabrication sequence starts by depositing another layer of silicon dioxide 203 on the top of the layer 202 as indicated in FIG. 2a. Oxide layer 202 is formed on top of the substrate 201 by oxidation. It is also possible that the layer 202 is grown with a sufficient thickness so that the deposition of the silicon dioxide layer 203 is not necessary.

In the next step of the process, layers 202 and 203 are patterned by common photolithography techniques, and as a result, photo-resist layer 204 is formed as shown in FIG. 2a. The patterned geometry 204 is the first step in defining the ring feature 108 in FIG. 1. Layer 204 serves as a mask during the next step where the layers 203 and 202 are etched, resulting in the structure shown in FIG. 2b. After the etching is completed, the photoresist layer 204 is removed, and a new silicon dioxide layer 206 is grown. This results in the structure shown in FIG. 2c. This completes the formation of the feature 108 as a ring of a sufficient thickness, approximately 4000 Angstroms, formed on the starting semiconductor substrate. The feature 108 is thus formed entirely from the silicon dioxide, however, it is clear to those skilled in the art that other materials such as silicon nitride or a sandwich of silicon dioxide and a silicon nitride can be used. The shape of the structure 108 also does not have to be circular, any enclosed shape such as polygon or ellipse is acceptable.

Figure 2D:
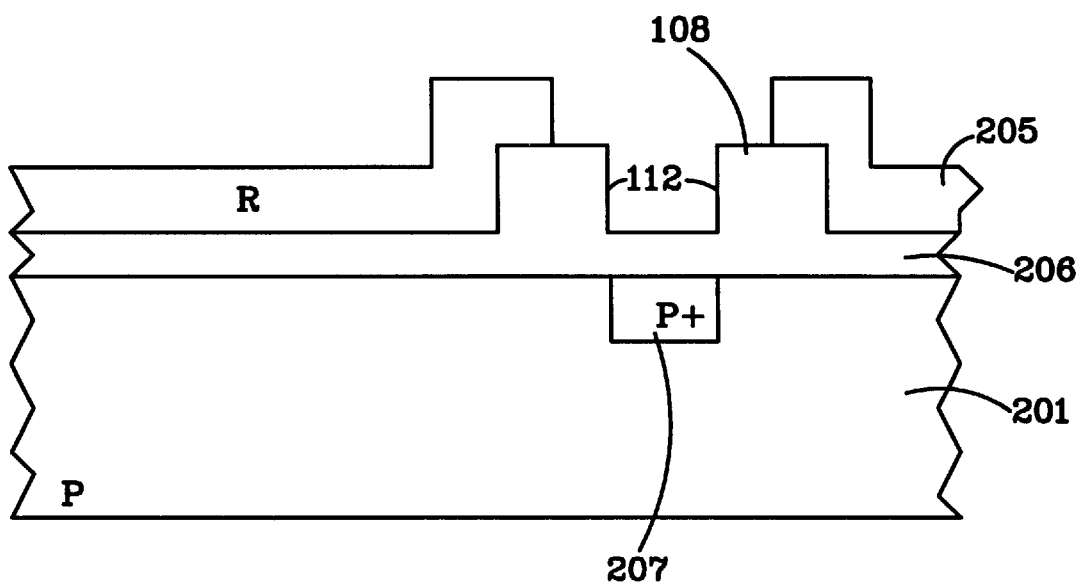

In the next step, another photo-resist layer 205 is patterned as shown in FIG. 2d, covering the layer 206 and portions of the ring 108. This layer serves as a mask for the subsequent ion implantation step that forms the p+ region 207. The region 207 is defined by the mask 205 and also by the inner edge of the ring 108. As a result, the region 207 is self-aligned to the inner region 112 (also see FIG. 1) of the LOD structure 113. The ring 108 continues to serve as an implantation mask for the remaining ion implantation steps of the rest of the fabrication process.

In the subsequent step the Photoresist layer 205 is removed and a layer 208 is deposited over the entire device surface. The layer 208 is, for example, silicon nitride. Nitride deposition is part of the industry's well know processing sequence called the Local Oxidation of Silicon (LOCOS) process. The LOCOS process is used to define the active and passive regions on the substrate. Transistors and other active devices such as the CCD pixels are placed in the active regions. There are other techniques of dividing the starting substrate into active and passive regions, however, this will not be discussed here since this is not an important part of this patent.

Figure 2E:
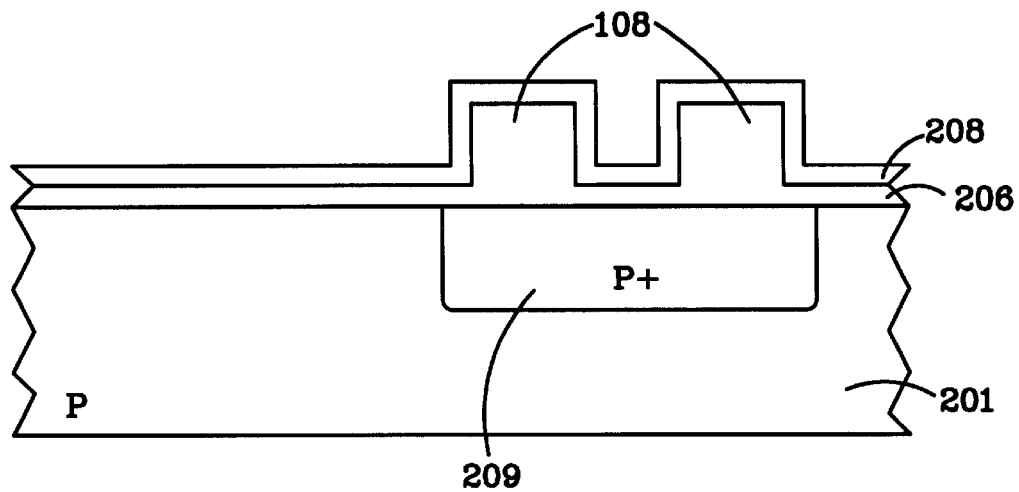
Figure 2F:
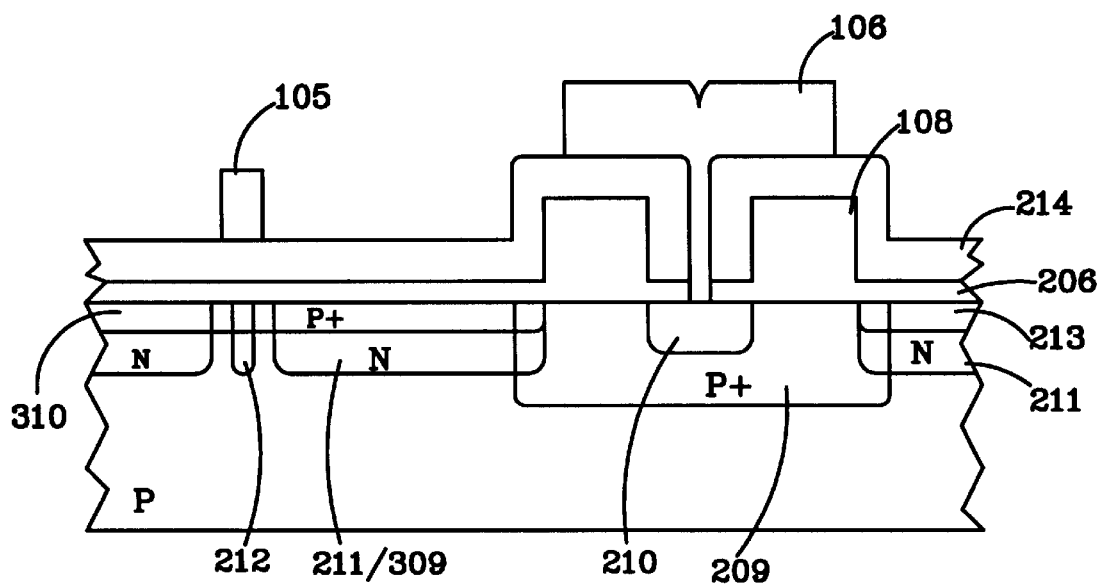

During the LOCOS processing a suitable heat treatment is used to cause the doping region 207 to diffuse further into the substrate and form a larger p+ doped region 209 as shown in FIG. 2e. The LOD fabrication sequence is then competed by removing the layer 208 and implanting the n+ drain region 210 through the layer 206 into the p-doped region 209. The region 112 (FIG. 1), defines the region 210 in a similar way as the region 207 was created previously. The doping region 210 is thus formed by a self-aligned processing step, since the region 210 is automatically aligned to the inner edges of the ring 108 as well as to the region 209. The cross section of the final LOD device, after completion of all major CCD cell fabrication steps, is shown in FIG. 2f. FIG. 2f includes the buried channel doping layer 211 with an additional phosphorus implant 309, the channel stop layer 212, the Virtual Phase electrode layer 310, the inter-level dielectric layer 214 and the metal interconnect layer 106 (FIG. 1). The processing steps that form these layers are explained below with reference to FIGS. 3a–3d. The layer formation will become clear from the detailed description of the CCD gate fabrication process that follows.

Figure 3A:
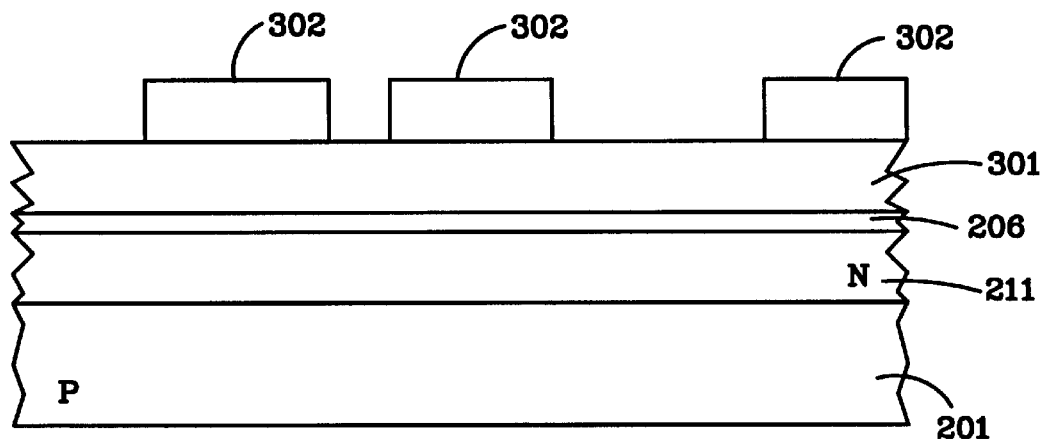
FIGS. 3a–3d show processing steps for producing the gate structure of the CCD device.

The fabrication processing steps for the gate structure of the CCD cells can be understood with the help of the device cross sections shown in FIGS. 3a–3d. The cross sections are taken in the direction 3—3 of FIG. 1 and represent one pixel of the sensor in the image sensing area. The processing steps start immediately after the LOD (FIG. 2e) sequence and after the p+ diffusion region 209 (FIG. 2c) has been formed. The gate fabrication starts with the buried channel implant 211, that is applied to the regions 104 (FIG. 1) defined by the buried channel mask followed by a suitable implant annealing. The channel regions are separated by the channel stops that later receive additional channel stop implants 212 (FIG. 2f). This is not visible either in FIG. 3 or in FIG. 1. In the next step, in FIG. 3a, a polysilicon layer 301 is deposited and doped by a suitable technique such as ion implantation or a furnace process. This is followed by deposition of an oxide layer 302 on top of the polysilicon layer 301. Oxide layer 302 is patterned using the polysilicon gate formation mask and the oxide is etched such that the selected regions 302 remain defined as indicated in FIG. 3a. This step thus determines all the future gates in the entire IC circuit.

In the CCD devices it is important that the adjacent gates that transfer charge are very close to each other. In conventional CCDs this is accomplished by using multiple polysilicon depositions and the polysilicon gates, after oxidation, overlap each other. Since this method will not be used here, it is important that the gates are separated by as narrow gaps as possible. However, there are practical limits to the lithography and the typical value of the gap that can be safely patterned is on the order of 0.3 um to 0.5 um. However, this value is not adequate for modern CDD devices and needs to be reduced. The large gaps would result in formation of parasitic potential wells between the gates that would trap charge and reduce or completely destroy the CCD Charge Transfer Efficiency (CTE). In order to reduce the gap size an oxide deposition and etch-back technique is employed.

Figure 3B:
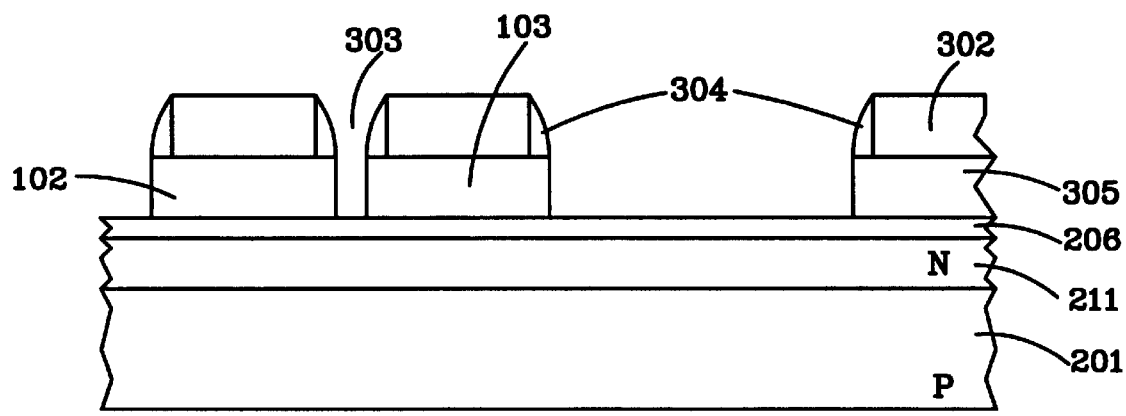
Figure 3C:
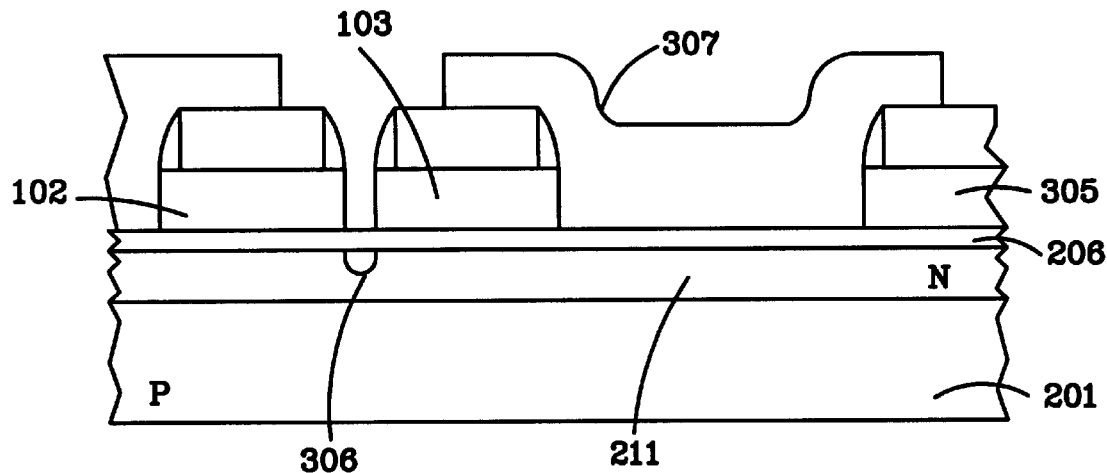
Figure 3D:
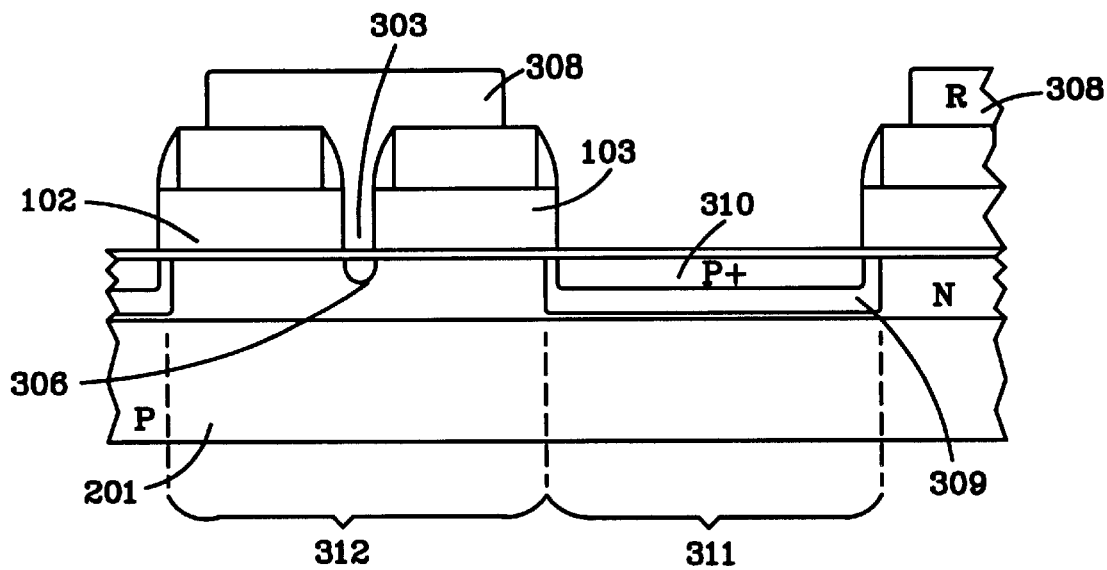

When a plasma or LPCVD method is used to deposit oxide, for example, oxide deposits in an isotropic fashion on all the underlying structures and surfaces horizontal as well as vertical. However, when it is etched it can be removed preferentially only in one direction. This result in formation of sidewall structures 304, as shown in FIG. 3b. The sidewall structures thus efficiently and very precisely narrow down the mask defined gaps and the polysilicon layer 301 can now be etched using the oxide 302 and the sidewall oxide 304 as a mask. This step thus forms the electrodes 102 and 103 as is shown in FIGS. 1 and 3b. With this process it is possible to controllably achieve polysilicon gate separations 303 on the order of 1000 Angstroms or less. The residual parasitic potential wells that could remain between the gate electrodes can be easily eliminated by a low dose self-aligned Boron implant 306, shown in FIG. 3c. The photo-resist mask 307 is used during this implant to protect the regions where the implant should not enter. This is also indicated in FIG. 3c. The CCD cell gate structure is completed by forming Virtual Electrodes in the region 110 (FIG. 1), as shown in FIG. 3d. The photo-resist mask 308 is used for this purpose. The VE electrode is formed by an n-type phosphorus implant 309 and a shallower p+ boron implant 310 followed by the suitable implant anneal. The VE region 311 is self-aligned to the clocked gate region 312. In the last steps of the process, an inter-level dielectric layer 214 (FIG. 2f) is deposited over the entire structure, etched to open the contact holes 107 to the gates and the holes 109 (FIG. 1) to the anti blooming drains (FIG. 2f). This is followed by a metal deposition, patterning, and etching to form the buss leads in the whole device which includes for example the bus leads 105 and 106 (FIG. 1).

The split gate CCD cells can be employed in a variety of image sensor architectures. A typical layout of a generic Frame Transfer (FT) device is shown as an example in FIG. 4. It consists of an active region 401 that is divided into three areas. The image sensing area 407, the memory area 408 and the serial register 422. The image sensing area consists of an array of cells 101 (FIG. 1) in two different placements A and B. The placement A is the mirror image of the placement B so that the adjacent cells can share the common LOD anti blooming structures and the vertical metal busses 105 and 106. There is a small difference in the location of contacts to the polysilicon, however. The contacts 405 connect the second polysilicon gates to the vertical first metal busses 105 and then to the horizontal second metal buss 404 via the contacts 419. The contacts 406 connect the first polysilicon gates also to the vertical metal busses 105 and then to the horizontal second metal buss 403 via the contacts 419. The LOD busses 106 are all connected to the single horizontal second metal buss 402 via the contacts 415. Since no light impinges on the memory area the LOD structure is not needed there and is eliminated. The gates are bussed horizontally by the first metal busses 409 for the first polysilicon gates and the busses 410 for the second polysilicon gates. Similarly as in the image sensing area the memory cells have two placement C and D that differ from each other only by the location of contacts 420 and 421. The memory area interfaces with the serial register 422. The design of the serial register cells 413 is very similar to the design of the memory cells except for the channel stop regions 414. The channel stops are not continuous along the serial register so as to allow charge from the memory to enter into the register laterally. Once charge enters into the serial register the last memory polysilicon gate confines it there. The serial register metal buss lines 411 and 412 are connected to the first and second polysilicon gates by the contacts 416 and 417 respectively. The serial register transports charge to the location 418 and then into the charge detection node that is not shown in the drawing.

When the memory area is eliminated from the FT image sensor a new device, called Full Frame (FF) image sensor is created. It is obvious to those skilled in the art that various other device architecture such as line sensors, Interline Transfer (IT) sensors, Frame Interline Transfer (FIT) sensors, TDI sensors, and many others can be created by combination of blocks described above. Without limiting the scope of the invention, this will not be further described here.

Figure 5:
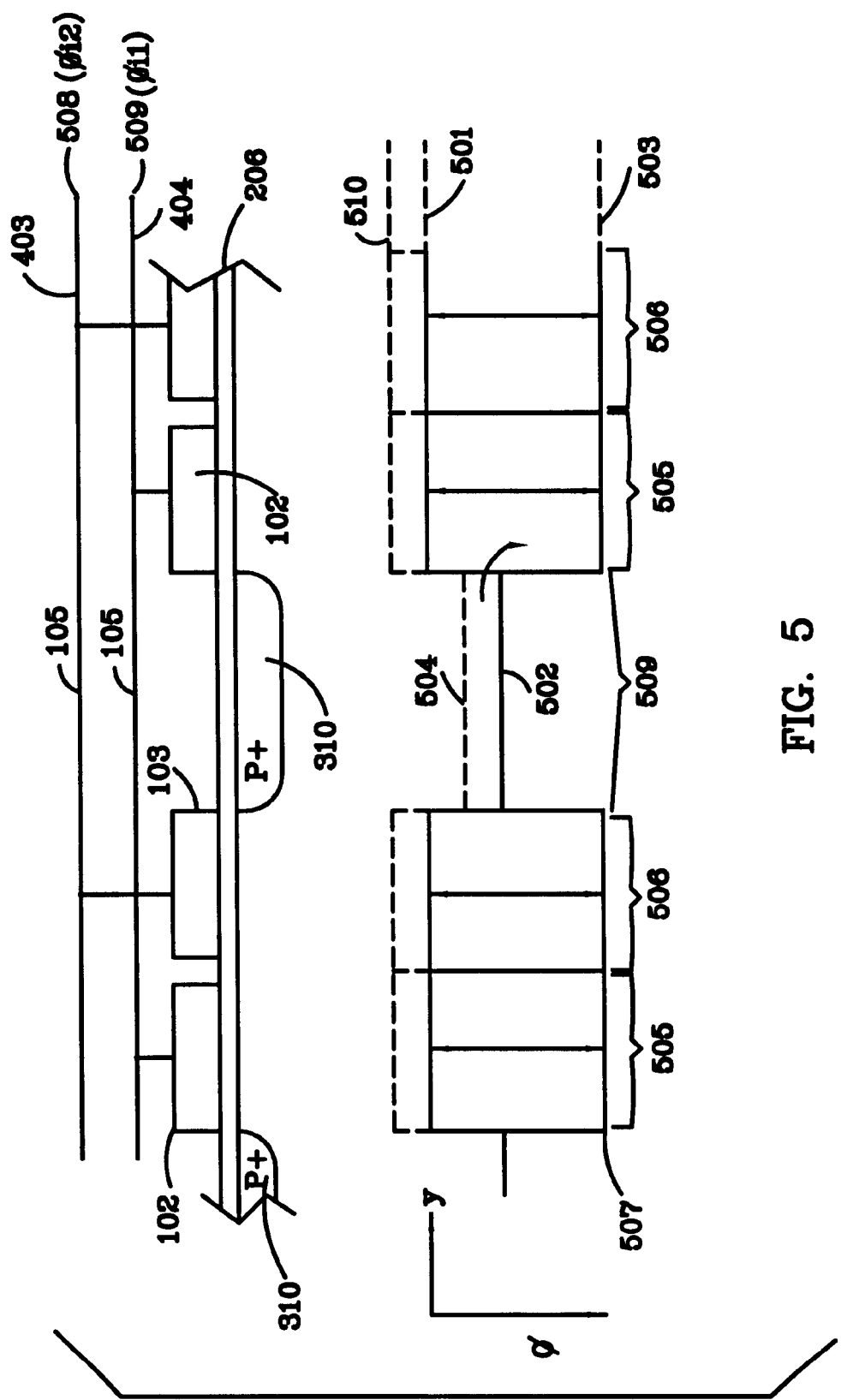
FIG. 5 shows a partial device cross-section and a potential profile diagram for the CCD cell.

The operation of the Split-Gate Virtual-Phase CCD (SGVPCCD) can be explained with the help of the potential profile diagrams shown in FIG. 5. In this drawing a simplified cross section of the cell 101 is given in the direction 2—2 (FIG. 1) with corresponding potential profiles 507. As the bias on the gates 102 and 103 changes, by applying appropriate voltages to the terminals 508 and 509, the potential in the clocked well regions 505 and 506 rises to the level 501, or is lowered to the level 502. When the clock voltage applied to the terminal 509 is high, the potential in the well region 505 is low, at the level 503, and the photo-generated charge 504 that has accumulated in the VE well region 509 flows into the region 505.

In the next step, when the high clock bias is applied to the terminal 508, the charge spreads also into the clocked well region 506. By lowering the clock bias at the terminal 509 in the next step, all charge is forced into the clock well region 506. Finally, when the both clock biases at the terminals 508 and 509 are low, charge is again transferred into the VE region 505 of the next cell. As can be easily seen, by changing the sequence of application of high clock voltage biases, first to the gates 103 and then to the gates 102, charge can be moved from right to left instead of left to right as was described previously. The two directional charge transfer is one of the key advantages of the SGVPCCD architecture.

When charge is not being transported and is being integrated, the clock biases can be lowered below their nominal low bias level. This causes potentials in the clocked regions 505 and 506 to rise to the level 510 and be pinned there. The pinning phenomenon occurs when the holes from channel stops and the regions 310 flow under the gates 102 and 103 along the silicon-silicon dioxide interface. The presence of holes at the interface reduces dark current due to filling up the interface states. This is one of the advantages of the VPCCD technology that is preserved in the new SGVPCCD concept. Holes are not present at the interface during the charge transport, which eliminates the hot-hole impact ionization that typically occurs in the standard VP technology. The above-described clocking technique thus significantly improves the performance of SGVPCCD technology.

Figure 6:
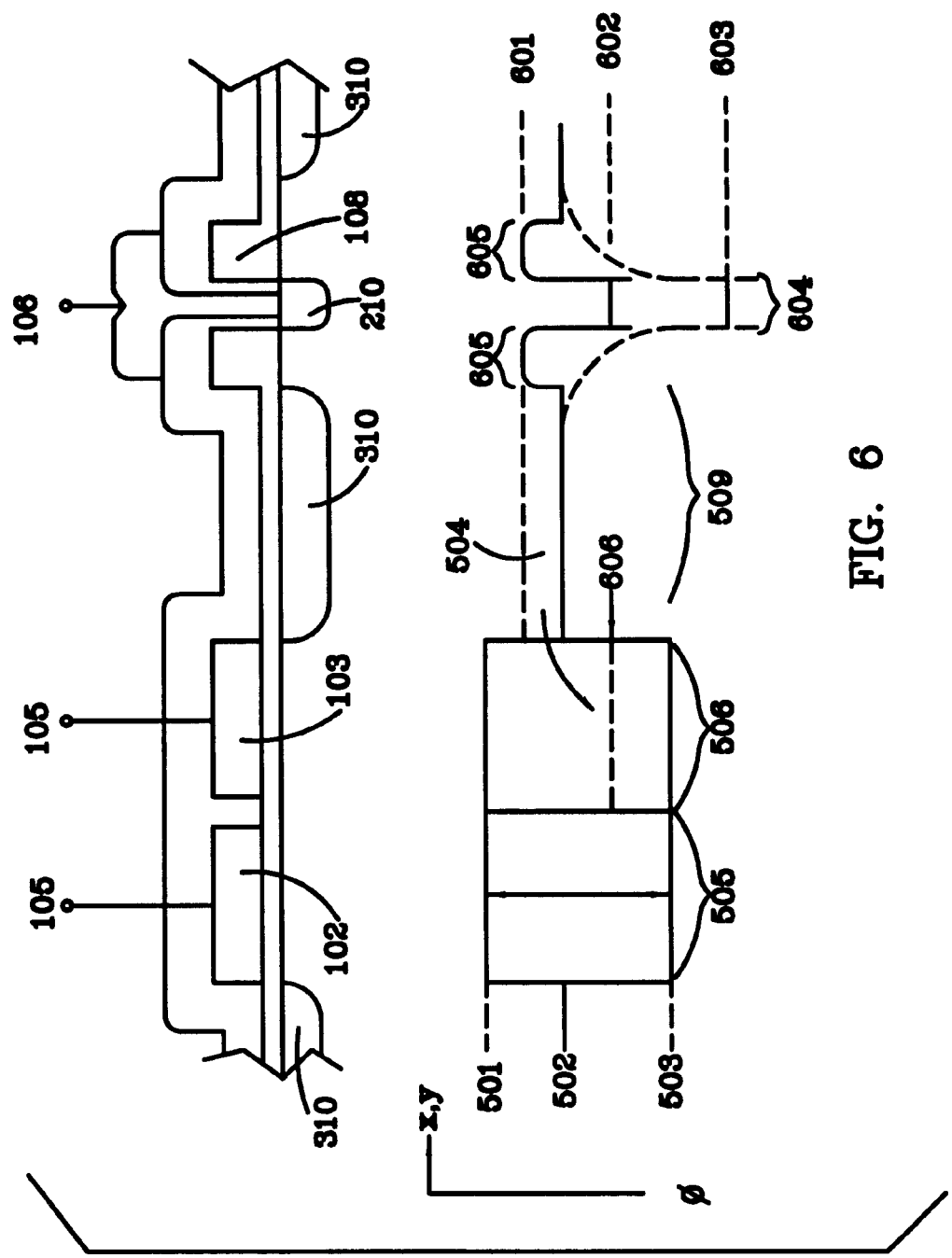
FIG. 6 shows another partial device cross section and a potential profile diagram for the CCD cell.

The operation of the LOD anti-blooming drain can be understood with the help of the drawing shown in FIG. 6. It represents again the potential diagrams of the cell 101 (FIG. 1), but only partially in the direction 3—3, then turning a corner and being completed in the direction 2—2 through the LOD feature 113. For the low drain bias level 602 the potential in the region 605 stays at the level 601. This is a charge overflow level that limits the amount of charge collected in the VE-well 509. Any additional charge generated by a local strong illumination, for example, will overflow the barrier 605 and flow into the drain 604. The collected charge can be completely cleared from the well 509 at any time by momentarily applying a high level pulse to the electrode 106. At the high drain bias 603 the potential barrier 605 is lowered, as shown by a dotted line, and all charge flows into the drain. This feature is important for the implementation of exposure control of the image sensor. The charge integration time and the timing of the LOD charge clearing pulses is controlled by the camera electronic system to always maintain a suitable level of charge in the wells 509.

The described LOD architecture, however, has another advantage as implemented in this embodiment. It allows expanding the dynamic range of the sensor by dividing the integration time into progressively shorter and shorter segments. During each integration time segment, the potential of the region 506 is slightly lowered. This is indicated in the drawing in FIG. 6 by an intermediate potential level 606. When the charge clearing pulse is applied to the drain, not all charge is cleared from the pixels. Only the charge that extends into the VE region 509 is removed. After the clearing step is completed, and the LOD drain bias is returned to the original level 602, more charge can be integrated in the well 509. Since each charge integration segment has a shorter and shorter duration, a piece-wise nonlinear response to the impinging illumination results that in an extended the Dynamic Range (DR) of the sensor. This is yet another important feature of the SGVPCCD technology that allows fabricating sensors accommodating high dynamic range scenes.

Figure 4:
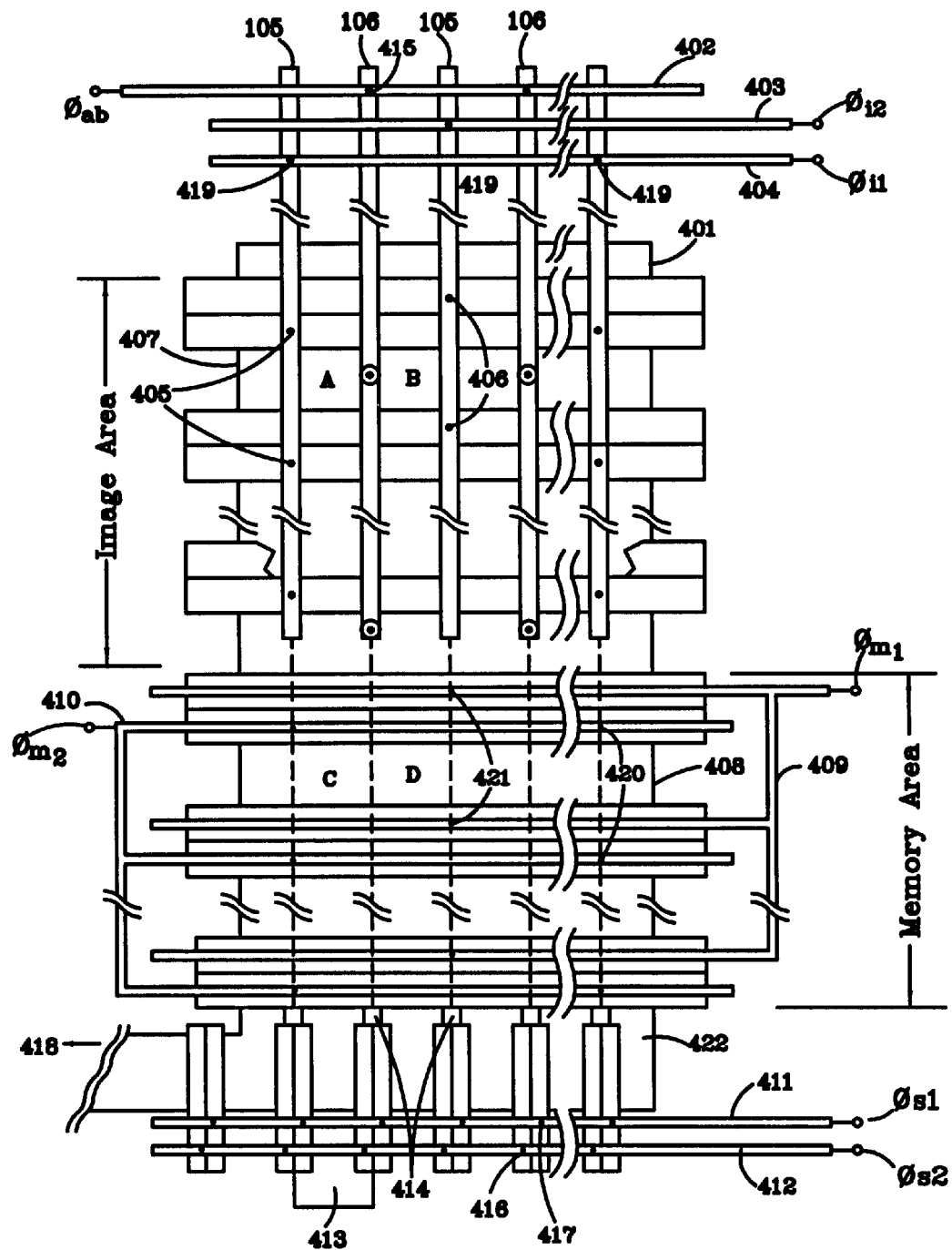
FIG. 4 shows a generic Frame Transfer architecture that utilizes the CCD cell of the present invention.
Figure 7:
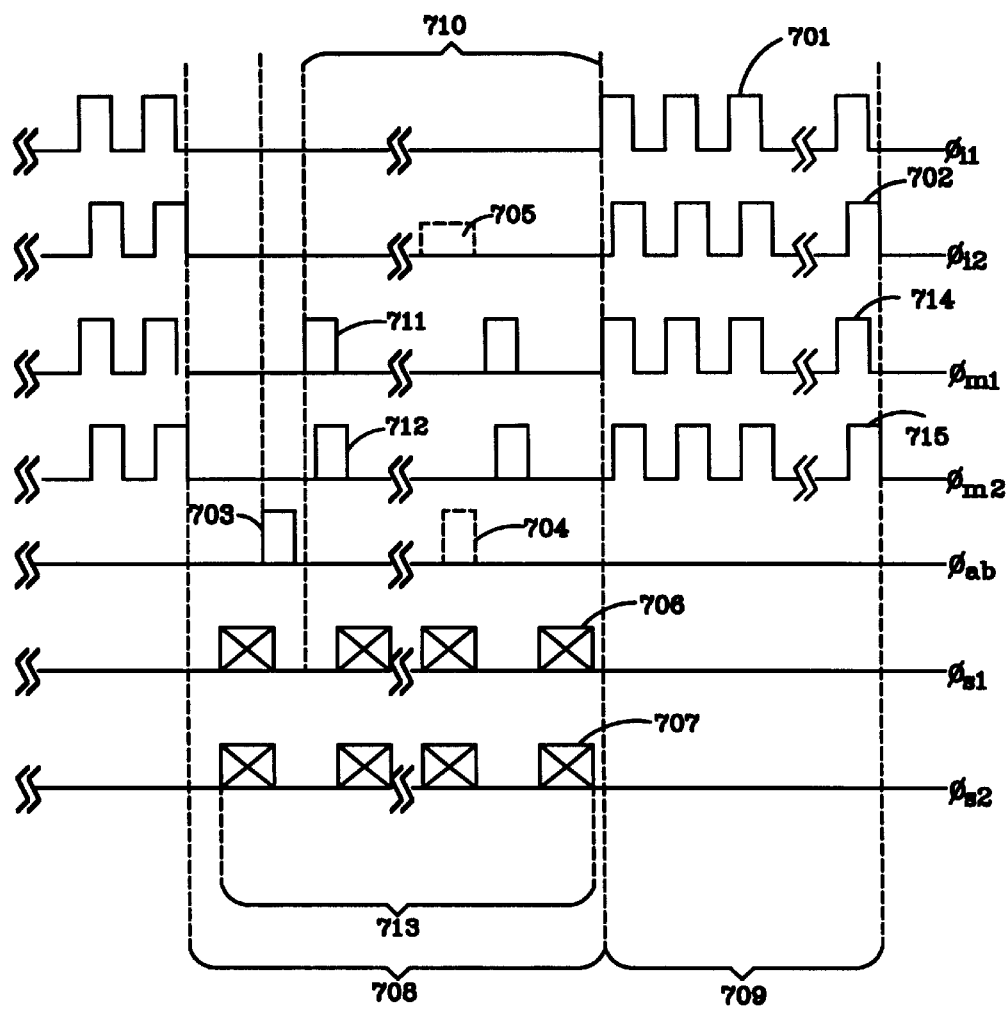
FIG. 7 shows a timing diagram for the device shown in FIG. 4.

For completeness of description the timing diagram of the device shown in FIG. 4 is presented in FIG. 7. The clocking waveforms 701 and 702 are applied to the image area gates (102, 103) and clock pulses 714 and 715 are applied to the memory area gates and are shown in both integration 708 and charge transfer 709 intervals. It is important to note here that the high pulse levels must overlap in order to achieve a complete charge transfer in the SGVPCCD registers. The image exposure time is controlled by the position of the LOD charge-clearing pulse 703 and can be reduced from its maximum available length 708 to an arbitrary shorter length 710.

Extended DR operation is indicated by the dotted pulse lines 704 and 705. After the charge integration period 708 is completed charge is transferred into the memory during the interval 709. Charge readout from the memory is accomplished by applying pulse groups 706 and 707 to the serial register gates preceded by single pulses 711 and 712 applied to the memory gates. The dark current reduction pinning biasing technique, which was explained previously, is not shown in the drawings in FIG. 7 to preserve its clarity. Other timing combinations and modifications are also possible and can be developed by those skilled in the art. The timing presented here is an example and should not be construed as limiting the scope of the invention.

Figure 8A:
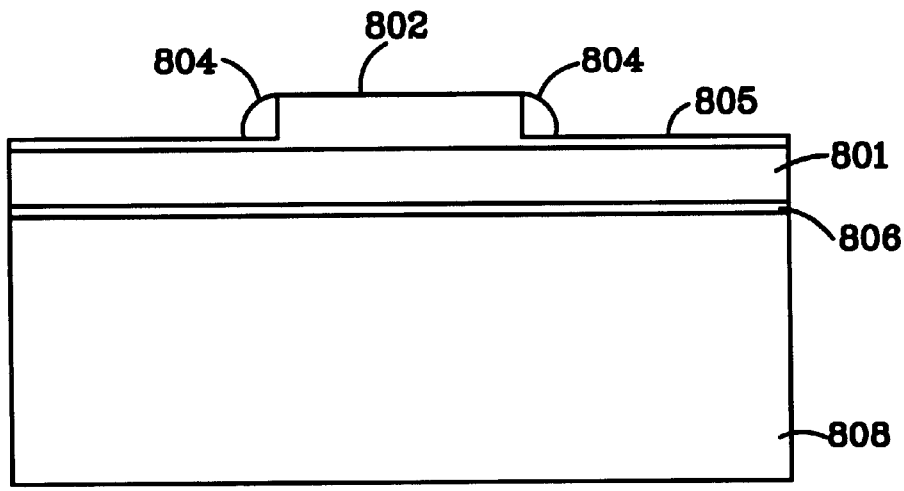
FIGS. 8a–8c show processing steps of another embodiment of the preset invention for producing the gate structure of the CCD device.
Figure 8B:
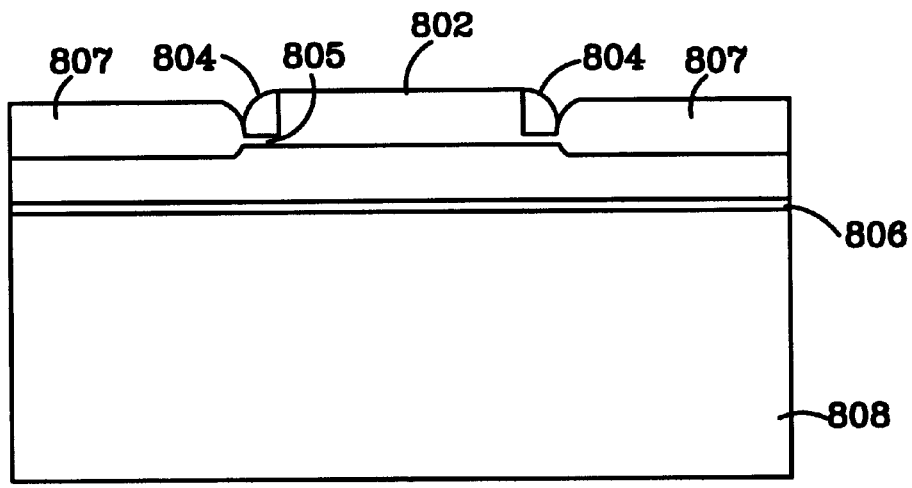
Figure 8C:
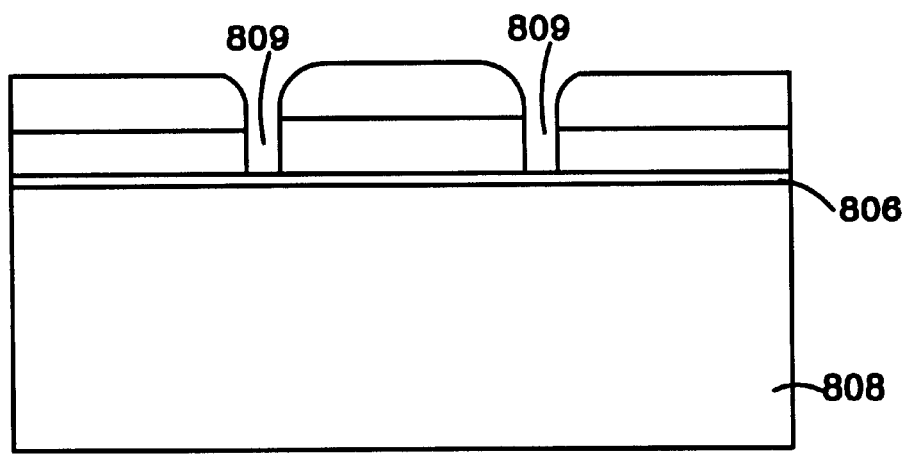

Another embodiment of the present invention for fabrication of CCD gates with narrow separations is shown FIGS. 8a–8c. Similarly, as in the previous case, polysilicon layer 801 is deposited on the substrate 808 over the gate oxide 806. A suitable oxide layer is deposited on top of the polysilicon, patterned and etched to form regions 802. In the next step, the polysilicon is oxidized to form a thin oxide layer 805. This is followed by deposition and etching off nitride layer, which results in formation of nitride sidewalls 804. The formation of nitride sidewalls 804 is followed by additional polysilicon oxidation that grows a thicker oxide 807 on top of the polysilicon 801. In the next step, the nitride sidewalls 804 are etched off followed by etching off only the thin oxide layer 805 that remained under the nitride. Finally the polysilicon is etched using the oxide as a mask thus forming the narrow separations 809. Additional inter-level oxide and metal layers can be deposited if needed (not illustrated). Finally, the entire device is coated by another protective oxide or nitride layer (not illustrated) and is subjected to various heat treatments to alloy the metal to silicon and to anneal possible material defects and processing damage. All these steps are well known in the art.

While the above description refers mostly to the p-type silicon substrates and silicon dioxide dielectrics, it is possible to use n-type substrates and different dielectrices as well as other types of semiconductor materials such as gallium arsenide, mercury cadmium telluride and others. In case that n-type starting material is used, a suitable p-well structure must be first diffused into the substrate near its surface. The p-well then essentially acts as a new p-type substrate for the sensor and needs to be provided with suitable p-substrate contacts. The Vertical Overflow Drain (VOD) can also be used with the SGVPCCD technology, however, this may not be practical and will not be further described in this patent.

It is obvious to those skilled in the art that the standard color filter arrays and micro-lens arrays are also compatible with the SGVPCCD technology and can be deposited on any sensor that is fabricated using this technology.

While this invention has been described with references to the illustrative embodiments, this description should not be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed:

1. A method of making a Split-Gate Virtual-Phase CCD cell, comprising the steps of:

providing a substrate of first conductivity type;

forming a dielectric layer on top of the substrate;

forming a buried channel of second conductivity type in the substrate;

implanting impurities of first conductivity type adjacent to the buried channel to form the channel stops;

forming clocked gates using a single deposition layer, wherein said clocked gates formed from said single deposition layer are separated into several clocked gate regions using an etching mask deposited on said layer; said etching mask being formed by standard lithography technigues together with an isotropic material deposition and an anisotropic etch-back process resulting in very narrow gaps between said clocked gate regions;

forming a virtual phase region of first conductivity type adjacent to said clocked gates in said buried channel; and forming a LOD anti-blooming drain structure adjacent to said virtual phase region by a self-aligned diffusion process utilizing an enclosed "doughnut shaped" mask.

2. The method according to claim 1, including the step of implanting and annealing impurities of first conductivity type through said narrow gaps into the buried channel.

3. The method according to claim 1, wherein the anti-blooming structure is created by forming an enclosed "doughnut shaped" structure on top of the substrate, implanting and diffusing impurities of the first conductivity type into the substrate through a central opening in the structure; and implanting and annealing the impurities of second conductivity type into the substrate through the same central opening of the structure.

4. A method of making a Split-Gate Virtual-Phase CCD cell, comprising the steps of:

providing a substrate of second a conductivity type; forming implanted and diffused well regions of sufficient depth of a first conductivity type in said substrate; forming a dielectric layer on top of said wells;

forming a buried channel of a second conductivity type within said wells of first conductivity type;

implanting impurities of first conductivity type adjacent to the buried channel to form channel stops;

forming clocked gates using a single deposition gate layer, wherein said clocked gates formed from said single deposition layer are separated into several clocked gate regions using an etching mask deposited on said layer; said etching mask being formed by standard lithography techniques together with an isotropic material deposition and an anisotropic etch-back process resulting in very narrow gaps between said clocked gate regions; and finally implanting and annealing impurities of first conductivity type through said narrow gaps into the buried channel;

forming a virtual phase region of first conductivity type adjacent to said gates in said buried channel; and forming an LOD anti-blooming drain structure adjacent to said virtual phase region by a self-aligned diffusion process utilizing an enclosed "doughnut shaped" mask.

5. The method according to claim 4, wherein the anti-blooming structure is created by forming a enclosed "doughnut shaped" structure on top of said well regions, implanting and diffusing impurities of the first conductivity type into said wells through a central opening in the structure; and implanting and annealing the impurities of second conductivity type into the said wells through the same central opening of the structure.

6. The method according to claim 4, wherein said gates formed from said single deposition gate layer are separated into several clocked gate regions by:

depositing and patterning thicker oxide layer regions on top of the gate layer followed by growing a very thin oxide layer on top of the gate layer; forming nitride sidewall regions on the sides of the defined thicker oxide regions;

further oxidizing the gate layer and etching off the nitride sidewalls; and completing the process by etching off only the thin oxide layer, followed by etching off the gate layer using remaining oxide as the etching mask.

* * * * *